(12) United States Patent
Chen

(10) Patent No.: US 12,438,019 B2
(45) Date of Patent: Oct. 7, 2025

(54) PROCESSING AND DETECTING APPARATUS

(71) Applicant: PlayNitride Display Co., Ltd., MiaoLi County (TW)

(72) Inventor: Yen-Mu Chen, MiaoLi County (TW)

(73) Assignee: PlayNitride Display Co., Ltd., MiaoLi (TW)

( * ) Notice: Subject to any disclaimer, the term of this patent is extended or adjusted under 35 U.S.C. 154(b) by 190 days.

(21) Appl. No.: 18/337,031

(22) Filed: Jun. 18, 2023

(65) Prior Publication Data
US 2024/0387211 A1    Nov. 21, 2024

(30) Foreign Application Priority Data
May 16, 2023 (TW) ................................. 112118007

(51) Int. Cl.
*H01L 21/67* (2006.01)
*B32B 43/00* (2006.01)
(Continued)

(52) U.S. Cl.
CPC ...... *H01L 21/67253* (2013.01); *B32B 43/006* (2013.01); *G01J 3/2803* (2013.01);
(Continued)

(58) Field of Classification Search
CPC ........ H01L 21/67253; H01L 21/67132; H10H 20/80; B32B 43/006; B32B 2309/72
See application file for complete search history.

(56) References Cited

U.S. PATENT DOCUMENTS 5,393,624 A * 2/1995 Ushijima ........... G01B 11/0683
                                                118/712
5,541,416 A * 7/1996 Washizuka ......... G01N 21/9501
                                                250/459.1
(Continued)

FOREIGN PATENT DOCUMENTS

CN    110873709    3/2020
CN    114393313    4/2022
(Continued)

OTHER PUBLICATIONS

Machine Translation of Chen, 2022 (Generated Feb. 25, 2025), Espacenet (Year: 2022).*
(Continued)

*Primary Examiner* — Andrew L Swanson
(74) *Attorney, Agent, or Firm* — JCIPRNET

(57) ABSTRACT

A processing and detecting apparatus configured to process and detect an object is provided and includes a carrying platform, a laser unit, a wavelength measuring unit, and a computing unit. The carrying platform is configured to carry the object, and the object includes a substrate and a plurality of micro light emitting diodes (LEDs) disposed on the substrate. The laser unit is configured to perform a working procedure on the object on the carrying platform and excite each of the micro LEDs to radiate a light signal. The wavelength measuring unit is configured to measure the light signal radiated by exciting each of the micro LEDs in real time to obtain a spectrum of each of the micro LEDs. The computing unit is configured to analyze the spectra of the micro LEDs to determine whether the working procedure is abnormal.

8 Claims, 12 Drawing Sheets

(51) Int. Cl.
*G01J 3/28* (2006.01)
*H10H 20/80* (2025.01)

(52) U.S. Cl.
CPC ....... *H01L 21/67132* (2013.01); *H10H 20/80* (2025.01); *B32B 2309/72* (2013.01)

(56) References Cited

U.S. PATENT DOCUMENTS

| | | | | |
|---|---|---|---|---|
| 6,537,833 | B1* | 3/2003 | Lensing | G01N 21/4738 438/15 |
| 7,215,689 | B2* | 5/2007 | Iehisa | B23K 26/24 372/29.011 |
| 7,477,405 | B2* | 1/2009 | Finarov | G03F 1/84 356/625 |
| 2010/0020306 | A1* | 1/2010 | Hall | H01S 5/0428 356/5.01 |
| 2017/0176331 | A1 | 6/2017 | Ryo et al. | |
| 2022/0357202 | A1* | 11/2022 | Valouch | G01J 3/26 |
| 2023/0009647 | A1 | 1/2023 | Yoo et al. | |

FOREIGN PATENT DOCUMENTS

| | | |
|---|---|---|
| CN | 114393313 B * | 12/2022 |
| KR | 20060014460 | 2/2006 |
| KR | 100762853 | 10/2007 |
| KR | 20220070522 | 5/2022 |
| TW | 202138789 | 10/2021 |

OTHER PUBLICATIONS

"Office Action of Taiwan Counterpart Application", issued on Dec. 1, 2023, p. 1-p. 8.
"Office Action of Korea Counterpart Application", issued on May 12, 2025, p. 1-p. 6.

* cited by examiner

PROCESSING AND DETECTING APPARATUS

CROSS-REFERENCE TO RELATED APPLICATION

This application claims the priority benefit of Taiwan application serial no. 112118007, filed on May 16, 2023. The entirety of the above-mentioned patent application is hereby incorporated by reference herein and made a part of this specification.

BACKGROUND

Technical Field

The disclosure relates to a processing and detecting apparatus.

Description of Related Art

With the advancement of semiconductor technologies, a manufacturing process of light emitting diodes (LEDs) is becoming more and more mature and diversified, and one of the developments is to reduce dimensions of the LEDs to form the so-called micro light emitting diodes (micro-LEDs).

In the manufacturing process of the micro-LEDs, a large number of the micro-LEDs may be transferred from one substrate to another, where a laser beam may be applied to irradiate the micro-LEDs, so that the micro-LEDs may be lifted off from one of the substrates.

However, the lift-off process performed by irradiating the LEDs by the laser beam sometimes fails to lift off the micro-LEDs as usual. For instance, the micro-LEDs are not completely lifted off, and the micro-LEDs are damaged during the lift-off process. Due to the small size of the micro-LEDs, manufacturers applying the conventional technologies are unable to immediately learn whether the laser lift-off process is completed as usual.

SUMMARY

The disclosure relates to a processing and detecting apparatus capable of perform immediate detections during processing.

According to an embodiment of the disclosure, a processing and detecting apparatus configured to process and detect an object is provided. The processing and detecting apparatus includes a carrying platform, a laser unit, a wavelength measuring unit, and a computing unit. The carrying platform is configured to carry the object, and the object includes a substrate and a plurality of micro light emitting diodes (micro-LEDs) disposed on the substrate. The laser unit is configured to emit a laser beam, where the laser beam is applied to perform a working procedure on the object on the carrying platform and excite each of the micro-LEDs to radiate a light signal. The wavelength measuring unit is configured to measure the light signal of each of the micro-LEDs in real time to obtain a spectrum of each of the micro-LEDs. The computing unit is configured to analyze the spectra of the micro-LEDs to determine whether the working procedure is abnormal.

In the processing and detecting apparatus provided in one or more embodiments of the disclosure, while the laser unit is performing the working procedure on the object, the laser unit also excites each micro-LED to radiate the light signal. Therefore, according to one or more embodiments of the disclosure, the wavelength measuring unit is applied to measure the light signal radiated by exciting each micro-LED in real time to obtain the spectrum of each micro-LED and accordingly determine whether the working procedure is abnormal by analyzing the spectra. Therefore, the processing and detecting apparatus provided by one or more embodiments of the disclosure may immediately detect whether there is any abnormality in the working procedure during processing.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
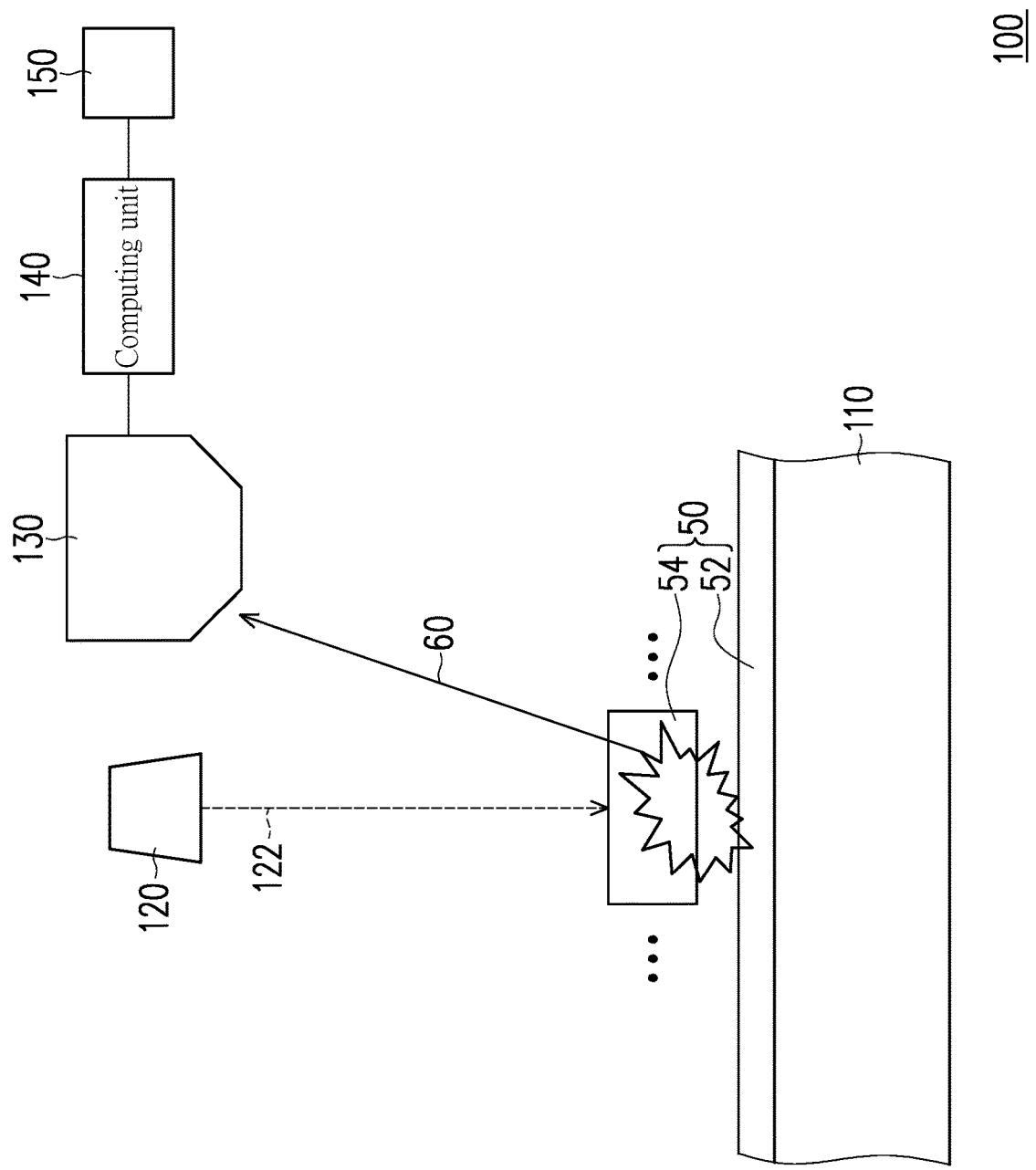
FIG. 1 is a schematic structural view illustrating a processing and detecting method according to an embodiment of the disclosure.
Figure 2:
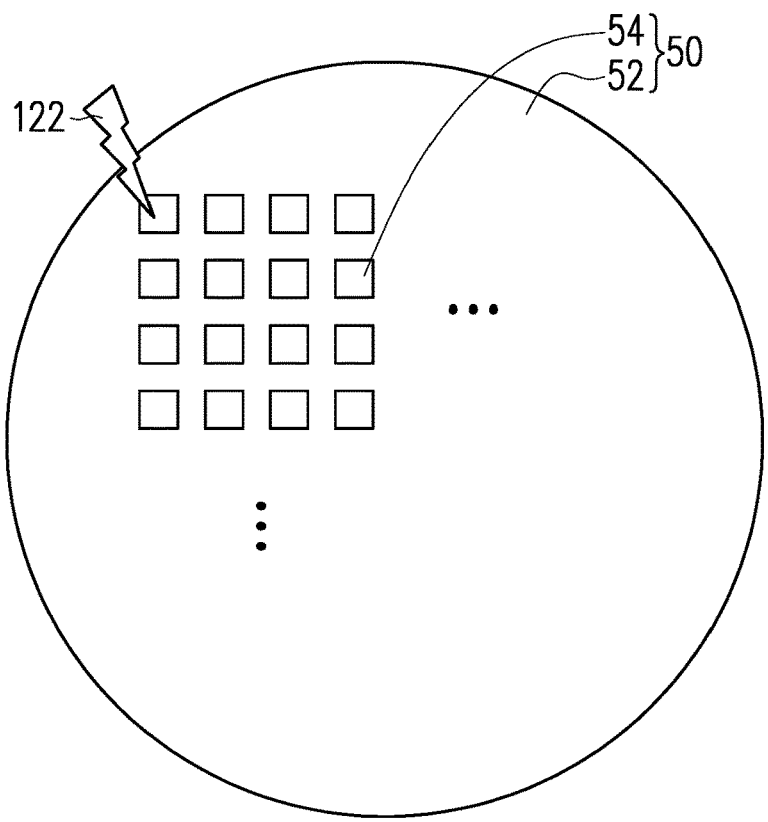
FIG. 2 is a schematic view illustrating that a laser beam emitted by the laser unit depicted in FIG. 1 is applied to perform a working procedure on an object.
Figure 3:
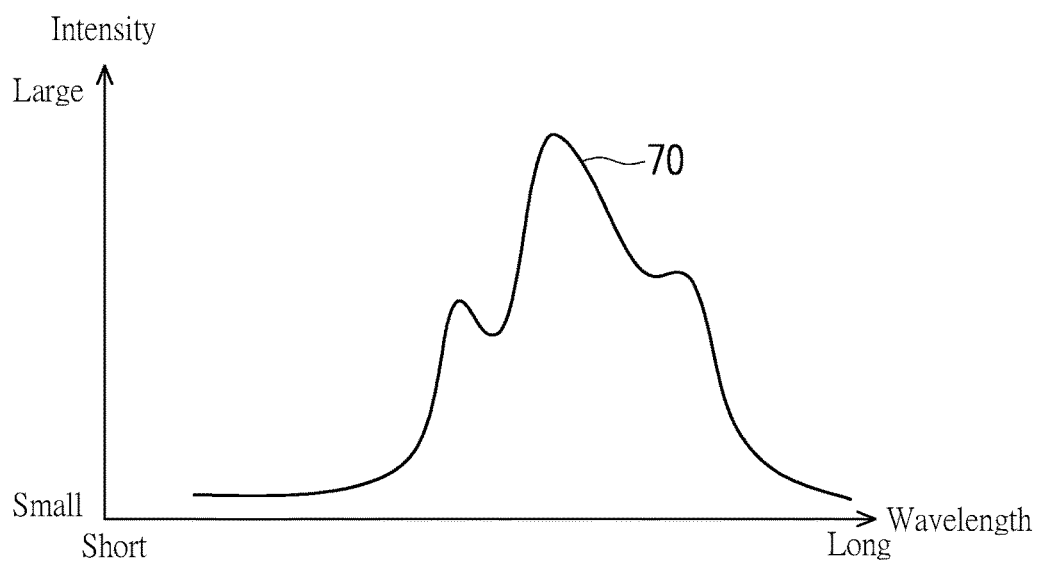
FIG. 3 is a schematic view illustrating spectra of micro-LEDs measured by the wavelength measuring unit depicted in FIG. 1.

FIG. 1 is a schematic structural view illustrating a processing and detecting method according to an embodiment of the disclosure. FIG. 2 is a schematic view illustrating that a laser beam emitted by the laser unit depicted in FIG. 1 is applied to perform a working procedure on an object. FIG. 3 is a schematic view illustrating spectra of micro-LEDs measured by the wavelength measuring unit depicted in FIG. 1. With reference to FIG. 1, FIG. 2, and FIG. 3, a processing and detecting apparatus 100 provided in this embodiment is configured to process and detect an object 50. The processing and detecting apparatus 100 includes a carrying platform 110, a laser unit 120, a wavelength measuring unit 130, and a computing unit 140. The carrying platform 110 is configured to carry the object 50, and the object 50 includes a substrate 52 and a plurality of micro light emitting diodes (micro-LEDs) 54 disposed on the substrate 52. In this embodiment, the substrate 52 may be a growth substrate, a transfer substrate, or a temporary substrate.

The laser unit 120 is configured to emit a laser beam 122, where the laser beam 122 is applied to perform a working procedure on the object 50 on the carrying platform 110 and excite each of the micro-LEDs 54 to radiate a light signal 60. The laser unit 120 is, for instance, a laser emitter or a laser beam source. In this embodiment, the working procedure is performed by emitting a laser beam 122 by the laser unit 120 to each micro-LED 54, so as to lift off the micro-LEDs 54 from the substrate 52. At the same time, the laser beam 122 that irradiates the micro-LEDs 54 also excites the micro-LEDs 54 to radiate a light signal 60, such as a fluorescent signal. In this embodiment, the laser beam 122 is, for instance, a laser pulse. In this embodiment, the emitted laser beam 122 lifting off the micro-LEDs 54 from the substrate 52 and the laser beam 122 radiating the light signal 60 by exciting each micro-LED 54 are the same laser beam. In some embodiments, when the laser beam 122 irradiates the substrate 52, the laser beam 122 also excites the substrate 52 to radiate the light signal 60, such as a fluorescent signal.

The wavelength measuring unit 130 is configured to measure the light signal 60 of each micro-LED 54 in real time to obtain spectrum 70 of each micro-LED 54. In this embodiment, the wavelength measuring unit 130 is, for instance, a spectrometer. The computing unit 140 is configured to analyze the spectra 70 of the micro-LEDs 54 to determine whether the working procedure is abnormal. In this embodiment, the computing unit 140 may be electrically connected to the wavelength measuring unit 130 to receive a spectral signal from the wavelength measuring unit 130. In this embodiment, the wavelength measuring unit 130 measures the light signal 60 radiated by exciting each micro-LED 54 in real time while the laser unit 120 is performing the working procedure on the object 50.

During the interaction between laser and substance, atoms and molecules of the material may be ionized through photon absorption, optical field ionization, collision ionization, and so on, and ionized plasma is generated, which then leads to the result of laser ablation of the material. For instance, as described above, the laser beam 122 is applied to lift off the micro-LEDs 54. In such a process, photons of different wavelength bands are usually radiated, which may result from various factors, such as radiation excited by electrons, electron ionization combined with radiation, generation of white light, non-linear effects generated by the laser beam traveling in plasma (expansion of the spectrum or displacement of the spectrum), and so on. As such, the laser beam 122 may excite the micro-LEDs 54 through photoluminescence to generate the light signal 60.

Therefore, results obtained in different processes or even different results obtained in the same manufacturing process may lead to light radiations with different frequency spectra (i.e., the light signal 60). It is referred to as a material characteristic spectrum of the laser process. Because of the characteristic spectrum, during the laser process, the wavelength measuring unit 130 may be applied to diagnose intermediate products, so as to detect online whether there is a problem with the products in the laser manufacturing process in real time. Accordingly, the yield or the potential issue of the products may be comprehensively diagnosed, analyzed, and fed back, so as to improve reliability of the products.

Figure 4:
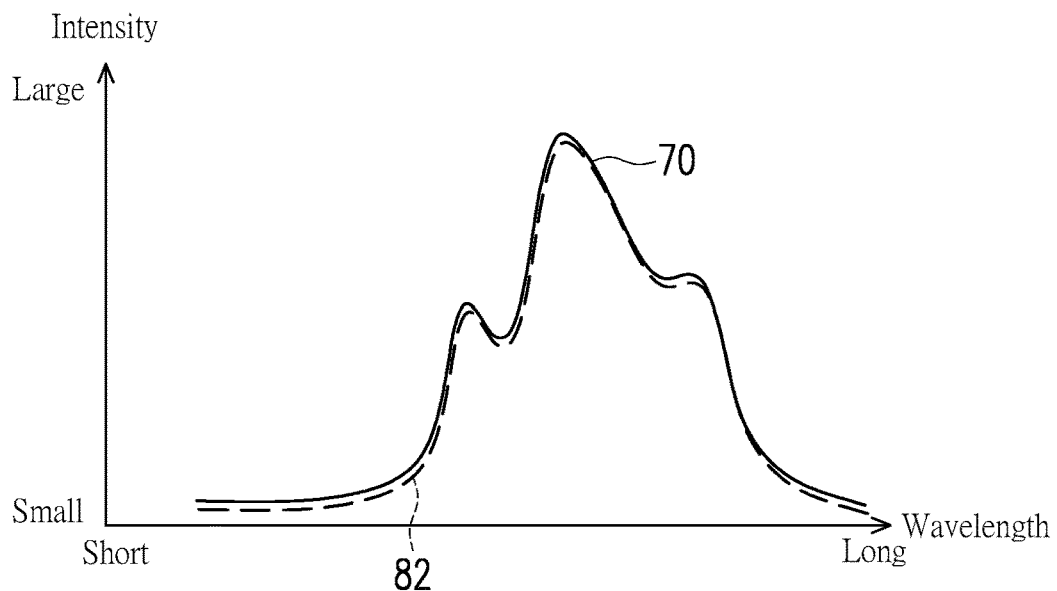
FIG. 4 is a schematic view illustrating comparisons between the spectra of the micro-LEDs depicted in FIG. 1 and at least one spectrum in a default database.

In this embodiment, the processing and detecting apparatus 100 further includes a default database, which may be stored in a storage device 150, where the storage device 150 may be electrically connected to the computing unit 140 to provide information required by the computing unit 140. The default database includes at least one normal spectrum or abnormal spectrum, and the computing unit 140 is allowed compare the spectra 70 of the micro-LEDs 54 with the at least one normal spectrum or abnormal spectrum in the default database, so as to determine whether the working procedure is abnormal by determining whether the spectra 70 of the micro-LEDs 54 are abnormal spectra. For instance, FIG. 4 is a schematic view illustrating comparisons between the spectra of the micro-LEDs depicted in FIG. 1 and at least one spectrum in a default database. As shown in FIG. 4, the spectrum 70 of the micro-LED 54 matches the abnormal spectrum 82 in the default database, and thus the computing unit 140 is able to determine that the working procedure performed on the micro-LED having the spectrum 70 is abnormal. At this time, in response to the fact that the spectrum 70 is an abnormal spectrum, the computing unit 140 performs the working procedure on the micro-LED 54 having the abnormal spectrum (e.g., the computing unit 140 commands the laser unit 120 to perform the working procedure again) or record the position (e.g., the computing unit 140 records the position of the micro-LED 54 having the abnormal spectrum on the substrate 52). Alternatively, in response to the fact that the spectrum 70 is an abnormal spectrum, the computing unit 140 stops performing the working procedure (e.g., the computing unit 140 commands the laser unit 120 to stop performing the working procedure). In an embodiment, the abnormality in the working procedure includes the laser beam 122 failing to irradiate the position of the micro-LED 54, the laser beam 122 irradiating the position of the substrate 52, the laser beam 122 destroying the micro-LED 54, or the laser beam 122 failing to remove the micro-LED 54 due to deflection or insufficient power. All of the above may lead to the abnormal spectrum.

Figure 5:
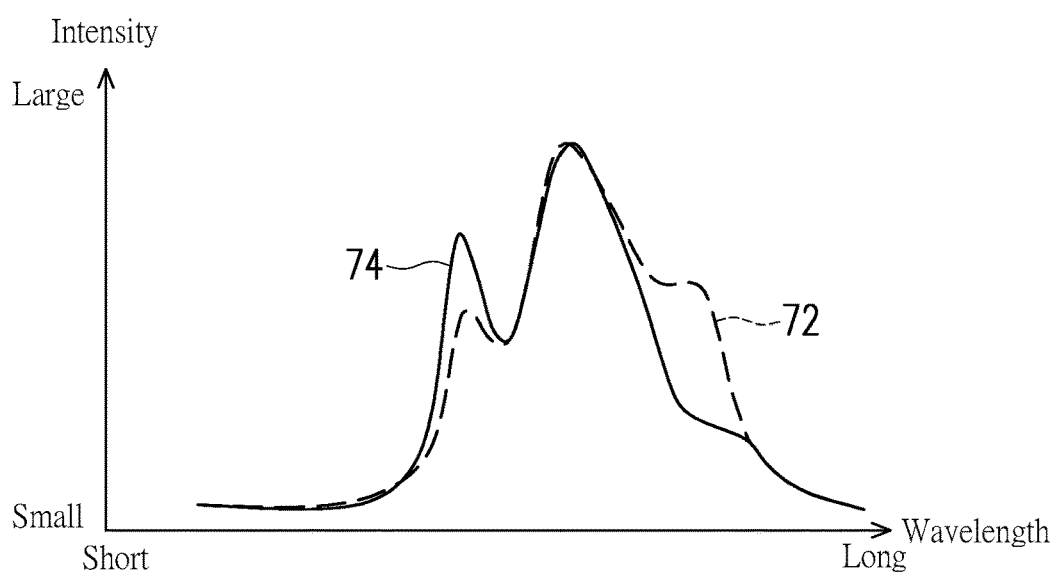
FIG. 5 is a schematic view illustrating a first spectrum and a second spectrum of the micro-LEDs depicted in FIG. 1.

FIG. 5 is a schematic view illustrating a first spectrum and a second spectrum of the micro-LEDs depicted in FIG. 1. With reference to FIG. 1 and FIG. 5, in this embodiment, the spectrum of each micro-LED 54 includes at least one first spectrum 72 and at least one second spectrum 74. The at least one first spectrum 72 and the at least one second spectrum 74 have different spectrum characteristics, such as an intensity value of a specific wavelength, a full width half maximum (FWHM) of a specific waveband, a ratio of intensities of two specific wavelengths, or the like, and the step of analyzing whether the spectrum of each micro-LED 54 by the computing unit 140 to determine whether the working procedure is abnormal includes detecting each micro-LED 54 is abnormal in the working procedure according to the at least one first spectrum 72 and the at least second spectrum 74.

In this embodiment, the micro-LED 54 having the at least one first spectrum 72 is normal, and the micro-LED 54 having the at least one second spectrum 74 is abnormal. The computing unit 140 may perform the working procedure again on the abnormal micro-LED 54 or record the position of the abnormal micro-LED 54, or the computing unit 140 may stop performing the working procedure.

Figure 6:
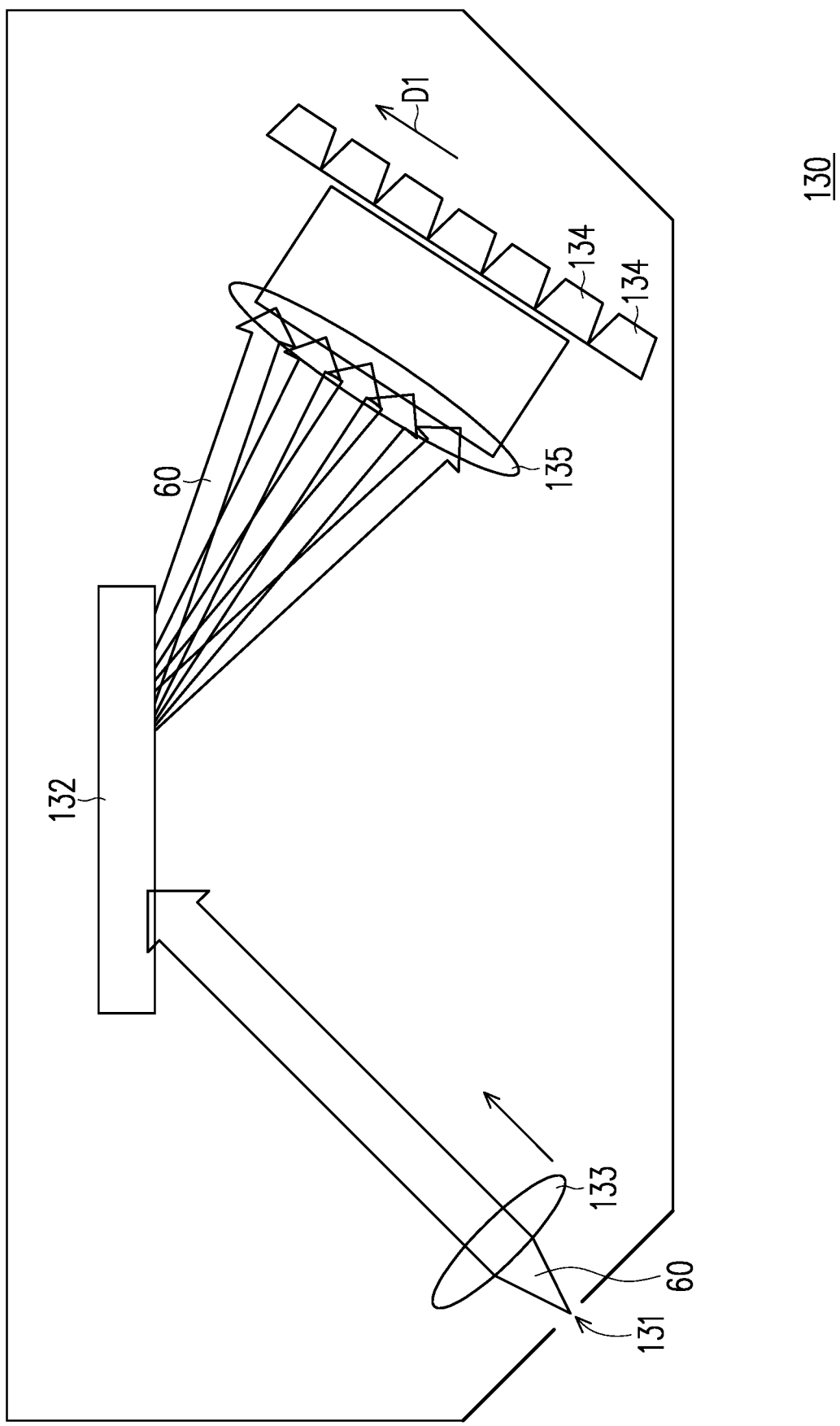
FIG. 6 is a schematic structural view illustrating the wavelength measuring unit depicted in FIG. 1.

FIG. 6 is a schematic structural view illustrating the wavelength measuring unit depicted in FIG. 1. With reference to FIG. 6, in this embodiment, the wavelength measuring unit 130 includes a dispersion device 132 and at least one photodiode 134 configured to detect the light signal 60. In this embodiment, for instance, the number of the at least one photodiode 134 is plural. The dispersion device 132 is disposed on a light path of the light signal 60 to disperse the light signal 60. In this embodiment, the dispersion device 132 is, for instance, a grating. These photodiodes 134 are arranged on the light path of the dispersed light signal 60 along a dispersion direction D1 of the dispersion device 132 to receive and detect the light signal 60. In this embodiment, a housing of the wavelength measuring unit 130 may have an opening 131 for the light signal 60 to enter the wavelength measuring unit 130. Next, a refractive device 133 collimates the light signal 60 and transmits it to the dispersion device 132. After the light signal 60 is dispersed by the dispersion device 132, light rays of different wavelengths are modulated by the refractive device 135 and converged on the photodiodes 134 at different locations. As such, the photodiodes 134 at different locations in the dispersion direction D1 are able to receive and detect the light signal 60 in different wavelength ranges, thereby achieving the effect of analyzing the spectrum of the light signal 60.

In order to achieve a good spectrum detection effect, according to this embodiment, a response time of these photodiodes 134 is shorter than a period during which the light signal 60 is radiated by exciting each micro-LED 54, so as to ensure that the light signal 60 is well detected. In addition, in this embodiment, the laser unit 120 emits the laser beam 122 to excite each micro-LED 54 to radiate the light signal 60, and the response time of the photodiodes 134 is shorter than a cycle of the laser beam 122 (i.e., a cycle of the laser pulse), so as to ensure that the light signal 60 excited by one single laser pulse from the laser beam 122 is well detected. For instance, the response time of the photodiodes 134 is, for instance, several to tens of nanoseconds or shorter (up to about one hundred picoseconds). The period during which the light signal 60 is radiated by exciting each micro-LED 54 is about tens of nanoseconds to microseconds. The sensitivity of the photodiodes 134 is about 1 watt, i.e., receiving 1 nanojoule within 1 nanosecond. When a pulse width of the laser beam 122 (i.e., the laser pulse) is 1 picosecond to 1 microsecond, a light intensity of the spectrum 70 is at the level of picojoule to nanojoule. A laser repetition rate of the laser beam 122 (i.e., the laser pulse) is, for instance, less than 1 Mhz (the laser repetition rate of 1 Mhz is equivalent to the cycle of the laser pulse of the laser beam 122 being 1 microsecond). In another embodiment, a photomultiplier tube can also be used to replace the photodiode 134 to achieve the sensitivity of single photon detection.

Figure 7:
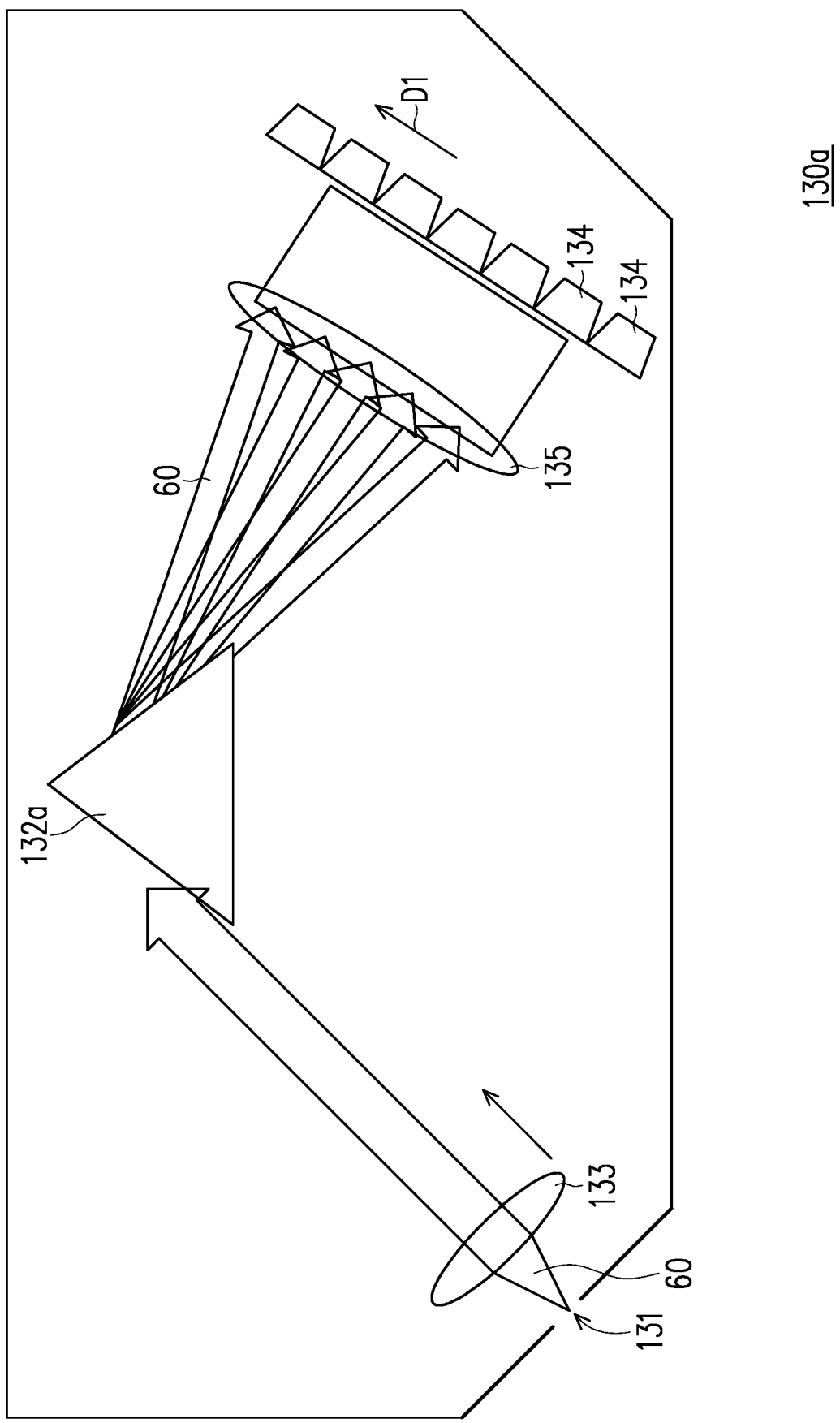
FIG. 7 is a schematic structural view illustrating a variation of the wavelength measuring unit depicted in FIG. 1.

FIG. 7 is a schematic structural view illustrating a variation of the wavelength measuring unit depicted in FIG. 1. With reference to FIG. 7, a wavelength measuring unit 130*a* of FIG. 7 is similar to the wavelength measuring unit 160 depicted in FIG. 6, while the difference therebetween lies in that a dispersion device 132*a* in the wavelength measuring unit 130*a* depicted in FIG. 7 is a prism (e.g., a triangular prism), and the prism may also disperse the light signal 60.

Figure 8:
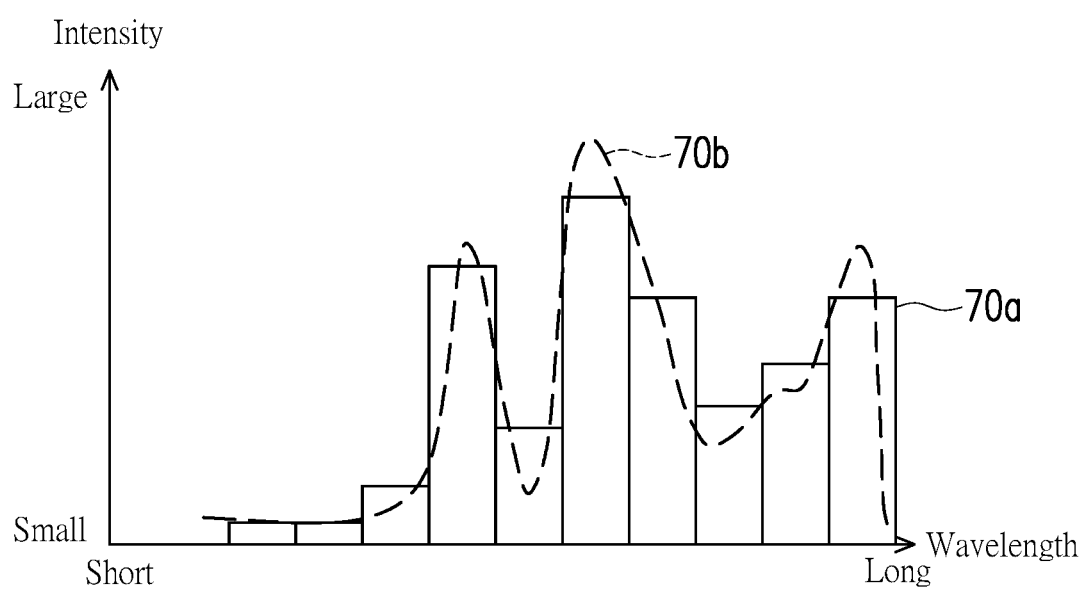
FIG. 8 is a diagram illustrating comparisons between the spectra measured by the wavelength measuring unit depicted in FIG. 6 and real spectra.

FIG. 8 is a diagram illustrating comparisons between the spectra measured by the wavelength measuring unit depicted in FIG. 6 and real spectra. With reference to FIG. 6 and FIG. 8, the photodiodes 134 adopted by the wavelength measuring unit 130 provided in this embodiment may be a plurality of photodiodes with a large light receiving amount (a relatively large light sensing area) but lower spatial resolution. Although the resolution of spectra 70*a* of the photodiodes 134 is worse than the resolution of real spectra 70*b*, as long as the spectra 70*a* have sufficient spectrum characteristics (e.g., an intensity value of a specific wavelength, a FWHM of a specific waveband, a ratio of intensities of two specific wavelengths, or the like), the computing unit is able to determine whether the spectra 70*a* are normal spectra or abnormal spectra.

Figure 9:
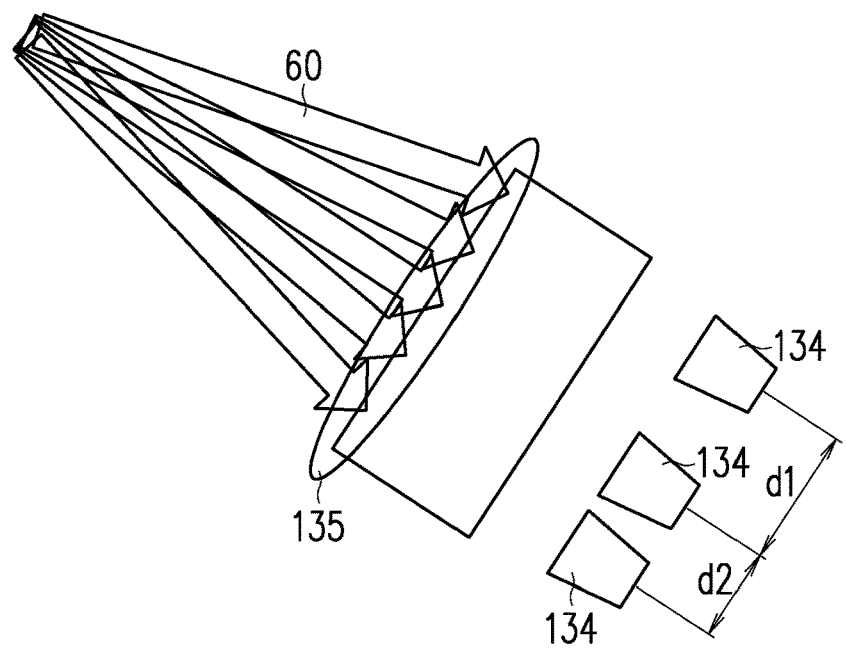
FIG. 9 is a diagram illustrating how photodiodes in a wavelength measuring unit are arranged according to another embodiment of the disclosure.
Figure 10:
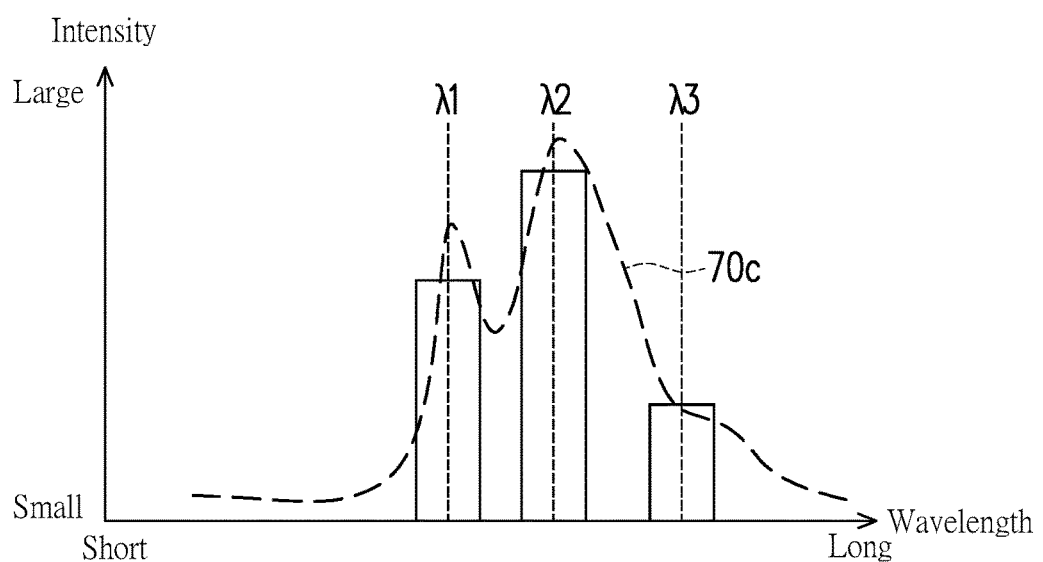
FIG. 10 is a diagram illustrating comparisons between the spectra measured by the wavelength measuring unit depicted in FIG. 9 and real spectra.

FIG. 9 is a diagram illustrating how photodiodes in a wavelength measuring unit are arranged according to another embodiment of the disclosure, and FIG. 10 is a diagram illustrating comparisons between the spectra measured by the wavelength measuring unit depicted in FIG. 9 and real spectra. With reference to FIG. 9 and FIG. 10, in the wavelength measuring unit provided in this embodiment, pitches between the adjacent photodiodes 134 are at least partially different (e.g., a pitch d1 is different from a pitch d2); due to such a configuration, wavelength differences detected by the adjacent photodiodes 134 are at least partly different. For instance, the detected wavelengths of three photodiodes 134 from the bottom left to the top right in FIG. 9 are λ1, λ2, and λ3, respectively, where the difference between λ3 and λ2 is, for instance, Δλa, and the difference between λ2 and λ1 is, for instance, Δλb. Here, Δλa is not equal to Δλb. Such a configuration of the photodiodes 134 allows the photodiode 134 to be disposed at a real spectrum 70*c* having characteristics, so as to adaptively respond to the to-be-detected spectral range, reduce the possibility of arranging the photodiodes 134 at a position where there is no spectrum characteristics or where the spectrum characteristics are not significant, and reduce the number of the photodiodes 134 to further simplify the operation of the computing unit 140 and lower the costs of the wavelength measuring unit.

Figure 11:
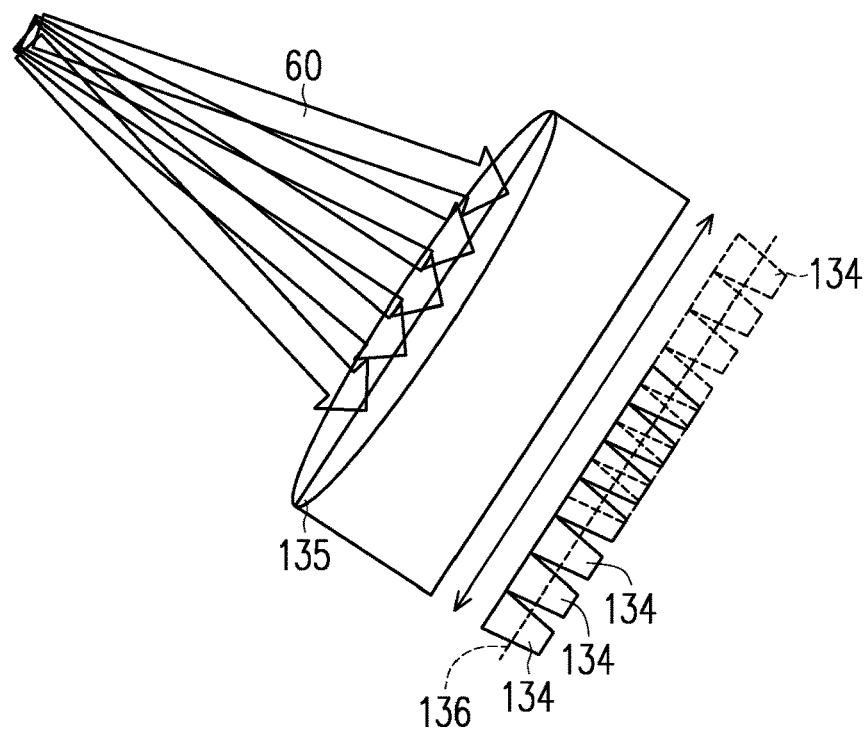
FIG. 11 is a diagram illustrating how photodiodes in a wavelength measuring unit are arranged according to another embodiment of the disclosure.
Figure 12:
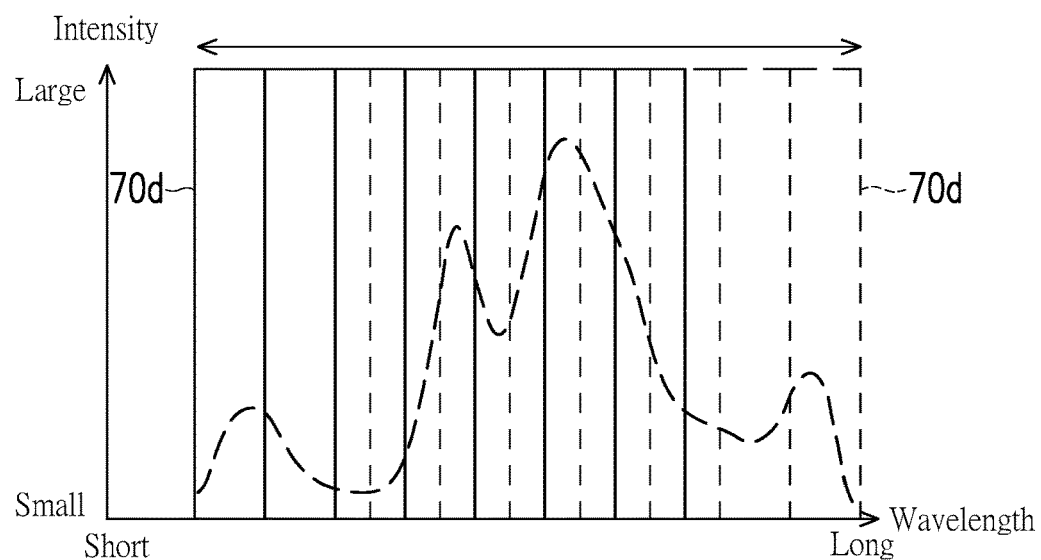
FIG. 12 illustrates a real spectral resolution range of the wavelength measuring unit depicted in FIG. 11.

FIG. 11 is a diagram illustrating how photodiodes in a wavelength measuring unit are arranged according to another embodiment of the disclosure, and FIG. 12 illustrates a real spectral resolution range of the wavelength measuring unit depicted in FIG. 11. In this embodiment, the photodiodes 134 may be installed on a straight rail 136, and a wavelength sensing range 70*d* of the wavelength measuring unit may be changed by sliding the photodiodes 134 to different positions on the straight rail 136.

Figure 13:
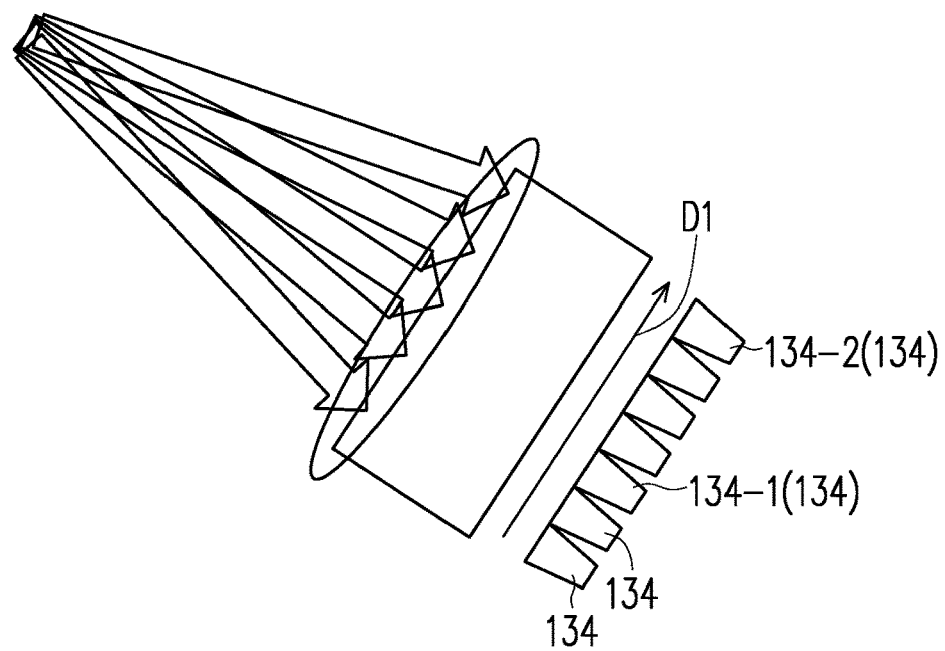
FIG. 13 is a diagram illustrating how photodiodes in a wavelength measuring unit are arranged according to yet another embodiment of the disclosure.
Figure 14:
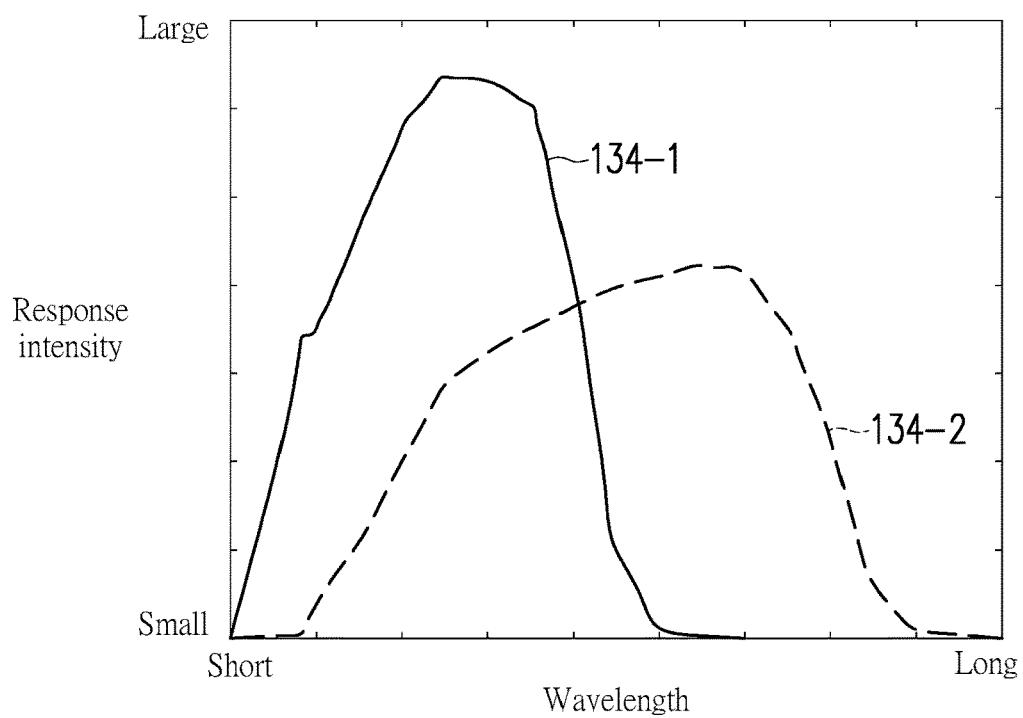
FIG. 14 illustrates response curves of two photodiodes in FIG. 13 to wavelengths.

FIG. 13 is a diagram illustrating how photodiodes in a wavelength measuring unit are arranged according to yet another embodiment of the disclosure, and FIG. 14 illustrates response curves of two photodiodes in FIG. 13 to wavelengths. With reference to FIG. 13, in the wavelength measuring unit provided in this embodiment, the response curves of the photodiodes 134 to wavelengths are at least partly different. For instance, the response curve of the photodiode 134-1 to wavelength in FIG. 13 is the response curve marked as 134-1 in FIG. 14, and the response curve of the photodiode 134-2 to wavelength in FIG. 13 is the response curve marked as 134-2 in FIG. 14. Different positions of the photodiodes 134 in the dispersion direction may be taken into account when a material of the photodiodes 134 is selected, and a material with a better response to the wavelength corresponding to the position may be selected.

Figure 15:
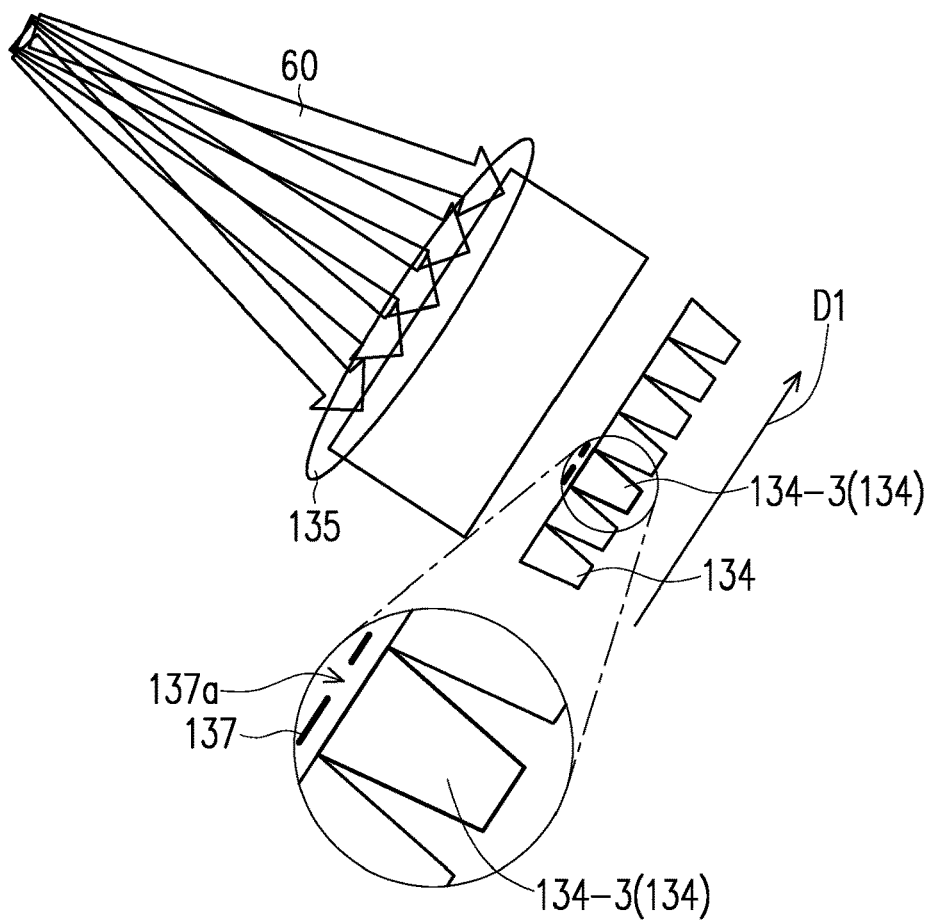
FIG. 15 is a diagram illustrating how photodiodes in a wavelength measuring unit are arranged according to yet another embodiment of the disclosure.
Figure 16:
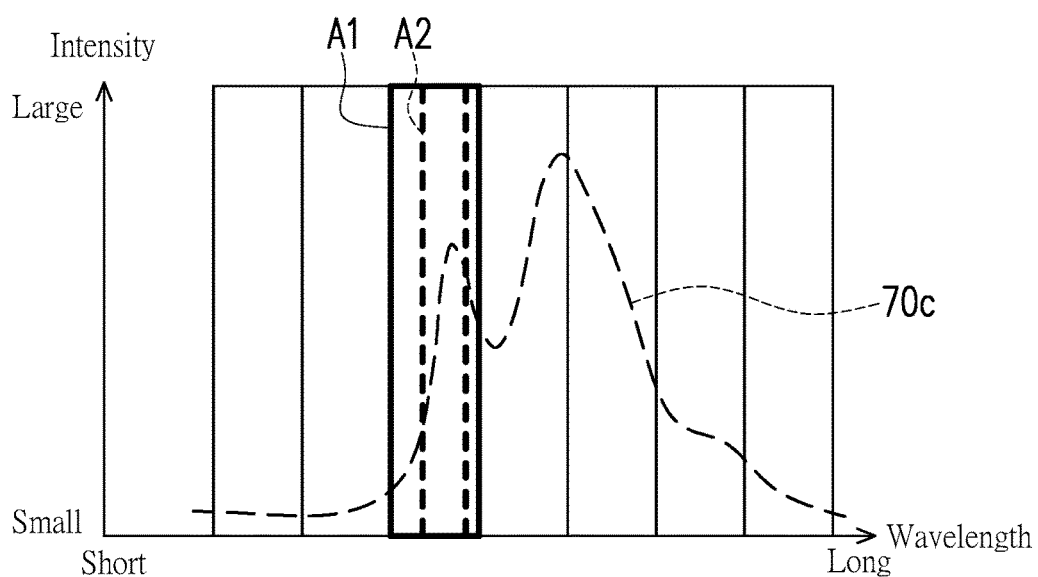
FIG. 16 illustrates a real spectral resolution range of the wavelength measuring unit depicted in FIG. 15.

FIG. 15 is a diagram illustrating how photodiodes in a wavelength measuring unit are arranged according to yet another embodiment of the disclosure, and FIG. 16 illustrates a real spectral resolution range of the wavelength measuring unit depicted in FIG. 15. With reference to FIG. 15 and FIG. 16, the wavelength measuring unit provided in this embodiment further includes a mask 137 disposed between at least one portion of the photodiodes 134 and the dispersion device 132 (as shown in FIG. 6), so as to reduce the wavelength sensing range of the photodiodes 134 along the dispersion direction D1, i.e., to reduce the wavelength range within which the light signal 60 travels. For instance, the mask 137 is disposed in front of the photodiode 134-3, the mask 137 has an opening 137a, and the opening 137a may be a slit or a void for the light signal 60 in a small range to pass through. Thereby, as shown in FIG. 16, since the mask 137 blocks a portion of the light signal 60, the wavelength sensing range of the photodiode 134-3 (i.e., the wavelength range within which the light signal 60 travels) may be reduced from a range A1 shown in FIG. 16 to a range A2. As such, the accuracy of detecting a peak of the real spectrum 70c may be improved.

Figure 17:
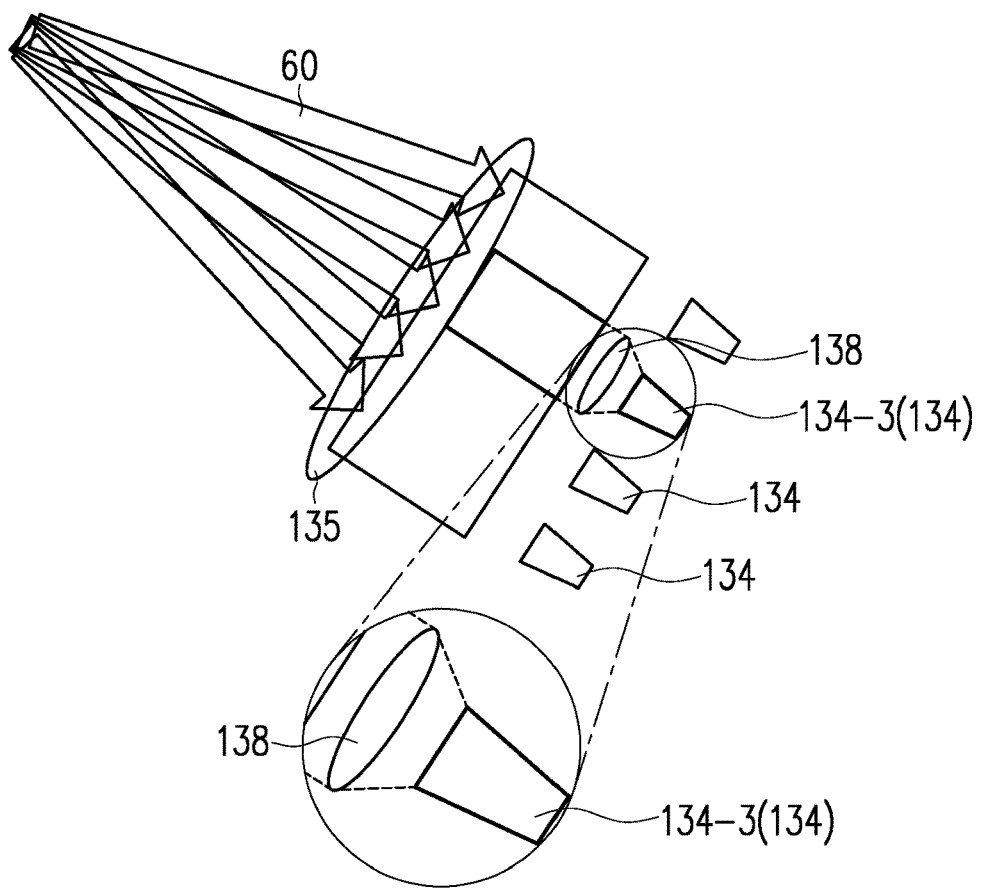
FIG. 17 is a diagram illustrating how photodiodes in a wavelength measuring unit are arranged according to still another embodiment of the disclosure.
Figure 18:
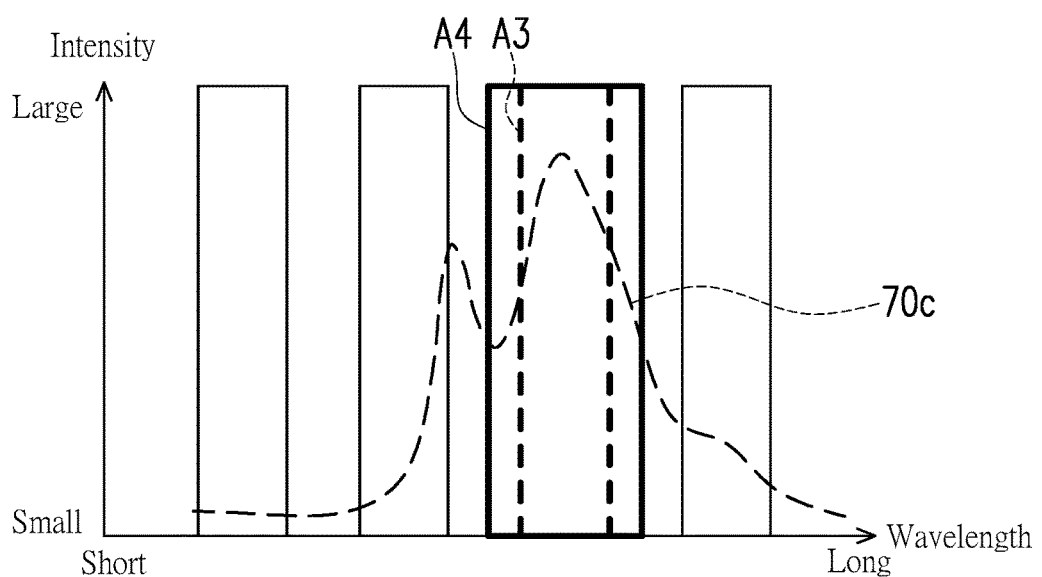
FIG. 18 illustrates a real spectral resolution range of the wavelength measuring unit depicted in FIG. 17.

FIG. 17 is a diagram illustrating how photodiodes in a wavelength measuring unit are arranged according to still another embodiment of the disclosure, and FIG. 18 illustrates a real spectral resolution range of the wavelength measuring unit depicted in FIG. 17. With reference to FIG. 17 and FIG. 18, in the wavelength measuring unit provided in this embodiment, the wavelength measuring unit further includes a light receiving device 138 disposed between at least one portion of the photodiodes 134 and the dispersion device 132 (as shown in FIG. 6), so as to amplify the wavelength sensing range of the photodiodes 134 along the dispersion direction D1, i.e., to amplify the wavelength range within which the light signal 60 travels. For instance, the light receiving device 138 is disposed in front of the photodiode 134-3. The light receiving device 138 is, for instance, a light receiving lens, a cylindrical lens, or a concave reflector, which may converge the light signal 60 in a relatively wide range on the photodiode 134-3. Thereby, as shown in FIG. 18, the wavelength sensing range of the photodiode 134-3 (i.e., the wavelength range within which the light signal 60 travels) may be expanded from a range A3 depicted in FIG. 18 to a range A4.

In the previous embodiments, the computing unit 140 is, for instance, a central processing unit (CPU), a microprocessor, a digital signal processor (DSP), a programmable controller, a programmable logic device (PLD), another similar apparatus, or a combination thereof, which should not be construed as a limitation in the disclosure. Besides, in an embodiment, each function of the computing unit 140 may be implemented in form of a plurality of programming codes. The programming codes are stored in a memory (e.g., the storage device 150), and the computing unit 140 executes the programming codes. Alternatively, in an embodiment, each function of the computing unit 140 may be implemented in form of one or a plurality of circuits. Whether each function of the computing unit 140 is implemented in form of software or hardware should not be construed as a limitation in the disclosure. In addition, the storage device 150 may be a random access memory, a flash memory, a non-volatile memory, a solid state drive, a flash drive, a magnetic disk, an optical disc, or any other appropriate storage device or memory.

Figure 19:
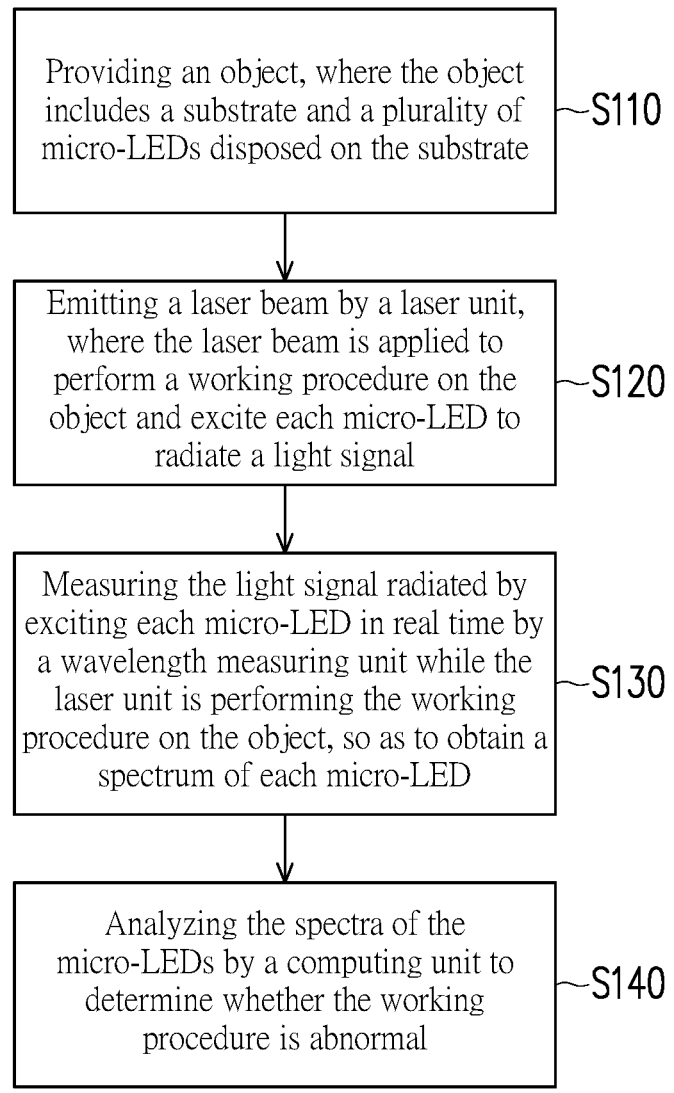
FIG. 19 a flowchart illustrating a processing and detecting method according to an embodiment of the disclosure.

FIG. 19 a flowchart illustrating a processing and detecting method according to an embodiment of the disclosure. With reference to FIG. 1 and FIG. 19, the processing and detecting method provided this embodiment may be realized by applying the processing and detecting apparatus provided in one or more of the previous embodiments, and the processing and detecting apparatus 100 in FIG. 1 is taken as an example for explanation. The processing and detecting method provided in this embodiment includes following steps. In step S110, the object 50 is provided, where the object 50 includes the substrate 52 and a plurality of micro-LEDs 54 disposed on the substrate 52. In step S120, the laser unit 120 is applied to emit the laser beam 122, and the laser beam 122 is applied to perform the working procedure on the object 50 and excite each micro-LED 54 to radiate the light signal 60. In step S130, the wavelength measuring unit 130 is applied to measure the light signal 60 radiated by exciting each micro-LED 54 in real time while the laser unit 120 is performing the working procedure on the object 50, so as to obtain the spectrum 70 of each micro-LED 54. In step S140, the computing unit 140 is applied to analyze the spectra 70 of the micro-LEDs 54 to determine whether the working procedure is abnormal. Details of each step of the processing and detecting method provided in this embodiment may be referred to as those provided in the previous embodiments of the processing and detecting apparatus and will not be repeated here, and the processing and detecting method provided in this embodiment may also immediately detect whether there is any abnormality in the working procedure during processing.

To sum up, in the processing and detecting apparatus and method provided in one or more embodiments of the disclosure, the laser unit excites each micro-LED to radiate the light signal while the laser unit is performing the working procedure on the object. Therefore, according to one or more embodiments of the disclosure, the wavelength measuring unit is applied to measure the light signal radiated by exciting each micro-LED in real time to obtain the spectrum of each micro-LED and accordingly determine whether the working procedure is abnormal by analyzing the spectra. Therefore, the processing and detecting apparatus and method provided in one or more embodiments of the disclosure may immediately detect whether there is any abnormality in the working procedure during processing.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A processing and detecting apparatus, configured to process and detect an object and comprising:
    a carrying platform, configured to carry the object, the object comprising a substrate and a plurality of micro light emitting diodes disposed on the substrate;
    a laser unit, configured to emit a laser beam, wherein the laser beam is applied to perform a working procedure on the object on the carrying platform and excite each of the micro light emitting diodes to radiate a light signal;

a wavelength measuring unit, configured to measure the light signal of each of the micro light emitting diodes in real time to obtain a spectrum of each of the micro light emitting diodes; and a computing unit, configured to analyze the spectra of the micro light emitting diodes to determine whether the working procedure is abnormal, wherein the wavelength measuring unit comprises:

a dispersion device, disposed on a light path of the light signal to disperse the light signal; and a plurality of photodiodes, arranged on the light path of the dispersed light signal along a dispersion direction of the dispersion device to receive and detect the light signal, wherein arrangement of the photodiodes comprises at least partially different pitch spacings between adjacent photodiodes.

2. The processing and detecting apparatus according to claim 1, further comprising a default database, the default database comprising at least one normal spectrum or abnormal spectrum, the computing unit is configured to compare the spectra of the micro light emitting diodes with the at least one normal spectrum or abnormal spectrum in the default database, and analyzing the spectra of the micro light emitting diodes to determine whether the working procedure is abnormal comprises comparing the spectra of the micro light emitting diodes with the at least one normal spectrum or abnormal spectrum in the default database.

3. The processing and detecting apparatus according to claim 1, wherein wavelength differences detected by the photodiodes are at least partially different.

4. The processing and detecting apparatus according to claim 1, wherein response curves of the photodiodes to wavelengths are at least partially different.

5. The processing and detecting apparatus according to claim 1, wherein the wavelength measuring unit further comprises a mask disposed between at least one portion of the photodiodes and the dispersion device to reduce a wavelength sensing range of the photodiodes along the dispersion direction.

6. The processing and detecting apparatus according to claim 1, wherein the wavelength measuring unit further comprises a light receiving device disposed between at least one portion of the photodiodes and the dispersion device to amplify a wavelength sensing range of the photodiodes along the dispersion direction.

7. The processing and detecting apparatus according to claim 1, wherein a response time of the photodiodes is shorter than a period during which the light signal is radiated by each of the excited micro light emitting diodes.

8. The processing and detecting apparatus according to claim 1, wherein the laser unit emits the laser beam to excite each of the micro light emitting diodes to radiate the light signal, and a response time of the photodiodes is shorter than a cycle of the laser beam.

* * * * *